United States Patent [19]

Rudolph et al.

[11] Patent Number: 5,497,004
[45] Date of Patent: Mar. 5, 1996

[54] ULTRAVIOLET SENSOR

[75] Inventors: Bernd Rudolph, Alzenau; Frank Kellner, Hammersbach; Uwe Kroenert, Bruchkoebel, all of Germany

[73] Assignee: Heraeus Xenotest GmbH, Hanau, Germany

[21] Appl. No.: 337,447

[22] Filed: Nov. 8, 1994

[30] Foreign Application Priority Data

Nov. 12, 1993 [DE] Germany ............... 43 38 807.8
Sep. 29, 1994 [DE] Germany ............... 44 34 858.4

[51] Int. Cl.$^6$ ............... G01J 1/04; G01J 5/08; G02B 1/00; G02B 5/02
[52] U.S. Cl. ............... 250/372; 252/588; 359/361
[58] Field of Search ............... 250/372; 359/361; 252/588, 587, 582

[56] References Cited

U.S. PATENT DOCUMENTS 4,597,629  7/1986  Kraushaar et al. ............... 252/588
5,093,576  3/1992  Edmond et al. ............... 250/372

FOREIGN PATENT DOCUMENTS

3902028A1  7/1989  Germany.
261524     3/1990  Japan.

OTHER PUBLICATIONS

Patent Abstracts of Japan, vol. 10, No. 245 (C–368), JP–A 61 076547, Apr. 19, 1986.

Primary Examiner—Constantine Hannaher
Assistant Examiner—Virgil O. Tyler
Attorney, Agent, or Firm—Oblon, Spivak, McClelland, Maier & Neustadt

[57] ABSTRACT

A UV sensor having a photodetector for measurement of UV radiation, an $SiO_2$-containing dispersive element disposed ahead of the photodetector in the direction of incident UV radiation and an optional housing having an entry opening for UV radiation. The dispersive element contains quartz glass with interiorly disposed boundary surfaces, the orientations of which are statistically homogeneously distributed.

13 Claims, 1 Drawing Sheet

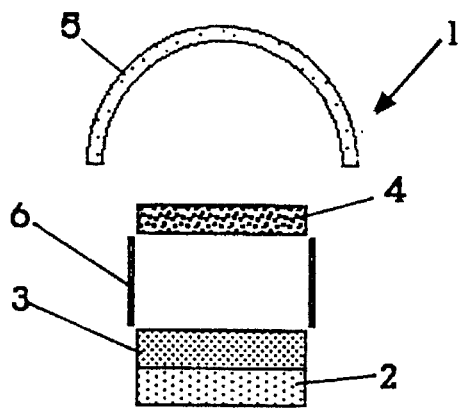
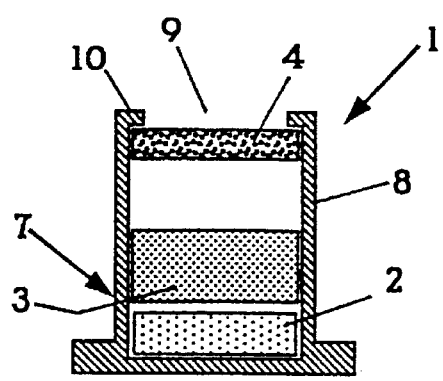
Fig. 1
Fig. 2
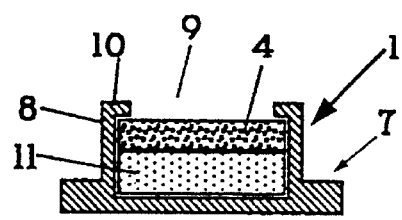
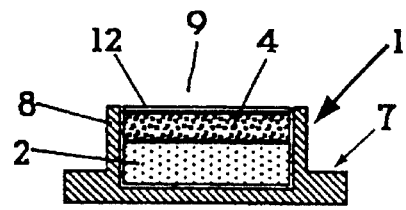
Fig. 3
Fig. 4
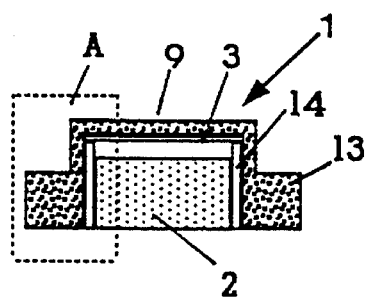
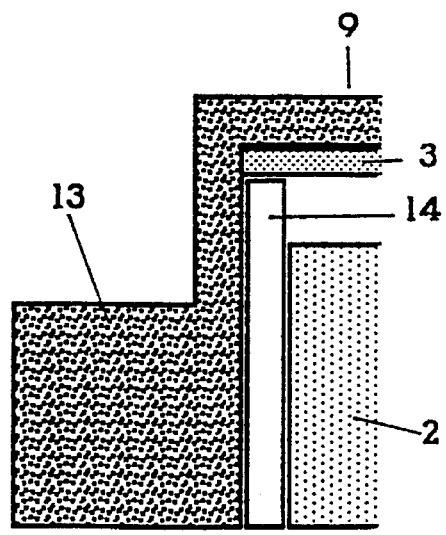
Fig. 5
Fig. 6

ULTRAVIOLET SENSOR

BACKGROUND OF THE INVENTION

1. Field of the Invention

The present invention relates to a UV sensor comprising an optional housing having an entry opening for UV radiation, a photodetector disposed in the housing for measurement of UV radiation optionally incident through the housing entry opening, and an $SiO_2$-containing dispersive element disposed ahead of the photodetector in the direction of incident UV radiation.

2. Description of the Prior Art

UV-irradiators or UV-lasers are used, e.g., in the curing of paints, in the photolytically assisted removal of coating material, in the disinfection of surfaces, liquids, and gases, and in tests of aging and weathering. UV sensors are commonly used to measure doses of UV radiation and to monitor the functioning of UV radiation sources.

In the measurement of UV radiation the sensor material or the sensor itself may suffer radiation damage from the radiation, which is of a relatively high energy. Further, and in many applications, there is the problem of adequately and accurately measuring radiation incident on a UV sensor from all directions.

A general UV sensor is disclosed in Ger. 3,902,028, incorporated herein by reference. This reference sensor consists of a cylindrical housing in which a vacuum photocell with a cesium chloride photocathode is mounted. The housing has an entry opening for incident UV radiation, which opening is partially blocked by a perforated plate which serves to reduce the intensity of the incident radiation. A dispersive element in the form of a diffusing screen is disposed between the perforated plate and the photocell. The diffusing screen comprises polycrystalline quartz material, preferably fritted quartz.

The diffusing screen of the reference sensor provides diffuse scattering of the light, thereby further reducing the intensity of the light incident on the photocell and appreciably reducing the dependence of the measurement on the direction of the incident light. The diffusive action of the diffusing screen is attributable to dispersion of the UV light at the grain boundaries of the quartz crystals and the particle boundaries of the fritted quartz. Accordingly, the diffusive properties of the diffusing screen depend on the grain size distribution of the quartz material used, and, fundamentally, on the manufacturing conditions of the screen. Thus, e.g., a very high sintering temperature results in disappearance of the grain boundaries and an increase in the transmissivity of the diffusing screen. At a lower sintering temperature the light attenuation of the diffusing screen is higher and the transmissivity is lower; further there is the hazard that open pores will survive between particles of the fritted glass which will compromise the gas-tightness of the UV sensor.

Because quartz crystal is not isomorphic as regards light transmission, light refraction and light diffraction, the diffusive properties of known diffusing screens depend on the fortuitous orientation of the quartz grains. Accordingly, it is difficult to provide reproducible optical properties, strength, solidity, and density of the diffusing screen. Since known diffusing screens have low strength they must be handled with care after sintering and are difficult or impossible to machine or otherwise process mechanically. In addition, soil particles accumulate in the open pores remaining on the surface of the diffusing screen, which particles are difficult to remove. Thus, with time, the transmissivity of prior art diffusing screens deteriorates in an indefinite, unpredictable manner. Contributing to this decrease in transmissivity is material damage caused by the energetic UV radiation in the crystal frit.

OBJECTS OF THE PRESENT INVENTION

Accordingly, one object of the present invention is to provide a dispersive element, and UV sensor containing a dispersive element, which provides measurement performance which is stable and reproducible, and which can be manufactured easily and inexpensively.

DETAILED DESCRIPTION OF THE PREFERRED EMBODIMENTS

These and other objects will become better understood as the invention is further described by reference to preferred embodiments thereof, and by reference to the Figures which are briefly described below:

BRIEF DESCRIPTION OF THE DRAWINGS

The drawings schematically illustrate exemplary embodiments of the invention; these embodiments will be described in more detail hereinbelow.

FIG. 1 shows an inventive UV sensor with a diffusing screen;

FIG. 2 shows a second embodiment of an inventive UV sensor;

FIG. 3 shows a third embodiment of an inventive UV sensor;

FIG. 4 shows a fourth embodiment of an inventive UV sensor;

FIG. 5 shows a fifth embodiment of an inventive UV sensor; and

FIG. 6 is an enlarged view of the region A of FIG. 5.

The objects of the invention have been attained by an advance in the art from that of known sensors, particularly the sensor in Ger. 3,092,028. In this regard, the dispersive sensor element of the present invention contains quartz glass with interior boundary surfaces, the orientations of which are statistically homogeneously distributed therein. This dispersive element can be used in any UV sensor, including the one described in Ger. 3,902,028.

Quartz glass is transparent to UV radiation in the wavelength range of from 300–400 nm and is a homogeneous, amorphous material having no grain boundaries. As a result, the drawbacks of the diffusing screens of known sensors, associated with the presence of grain boundaries, are avoided in the present invention: e.g., the invention dispersive element in the form of a quartz glass disc has high mechanical strength and can also be machined. Moreover, the invention dispersive element comprising quartz glass has high resistance to degradation by UV radiation over a wide range of radiation densities. Consequently, it is not generally necessary to employ protective elements to reduce the energy density of incident UV radiation on the invention dispersive element.

The invention dispersive element of, preferably, amorphous quartz glass material can be manufactured to be gas-tight (to gases other than hydrogen and helium, which can diffuse through quartz glass), can be easily fused to other quartz glass articles, and is easy to clean. It is easy to handle, and a UV sensor employing it can be manufactured easily, simply, and inexpensively. Ordinarily, the dispersive element of the present invention is in the form of an independent component disposed ahead of the photodetector; it may be rigidly affixed to the photodetector.

Because the dispersive element of the invention has no grain boundaries, its optical properties do not depend, or depend to only a minor extent, on the particle sizes of the starting materials used in its manufacture. The optical properties of the invention dispersive element are constant over its entire volume because it consists of a homogeneous material.

The homogeneous diffusivity of the invention dispersive element is achieved by providing a quartz glass element which has boundary surfaces whose orientations are statistically homogeneously dispersed in the space. Of course, statistically homogeneous distribution requires a very large number of inner boundary surfaces, which can be provided by, e.g., quartz glass made from finely distributed glass fragments which are sintered together, or by quartz glass provided with a large number of fine pores. This structure gives the quartz glass an opaque appearance, and the intensity of the UV light incident on the dispersive element is registered with a weighing factor related to the cosine of the incidence angle (i.e., the angle incident radiation makes with respect to the dispersive element surface). Consequently even radiation incident on the dispersive element at an obtuse incidence angle is taken into account in the measurement. This provides the desired directional independence of measurement.

The dispersive element of the present invention may consist entirely of quartz glass, and this glass is preferably not diffusely dispersive over the entire width of the element. Instead, the width of the dispersive element is preferably the dimension, or surface area, essentially perpendicular to the light path of the incident UV radiation.

An entry opening of the invention sensor forms an optical window for the incident UV radiation. It may be sealed off by a UV-permeable element, e.g. by the dispersive element itself, without losing its character as the entry opening for the UV radiation. Photodetectors useful in the invention sensor include, e.g., those which integrate the incident radiation over time, those which register the current measured value of the radiation intensity at each point of time and output a signal to a plotting device or other instrumentation, etc.

It is advantageous to equip the invention UV sensor with a dispersive element which has closed pores, in particular micropores produced in an otherwise dense matrix. Particularly good results are achieved with dispersive elements containing quartz glass with a pore volume fraction in the range of from 0.5–10, preferably <5 but including volume fractions of 1, 2, 3, 4, 5, 6, 7, 8 and 9, and all ranges therebetween. The pores are dispersion centers. They block direct transmission of light, and cause a high proportion of the incident light to be nondirectionally dispersed, thereby bringing about the desired diffusivity of the invention dispersive element.

The pores preferably have a closed, typically spherical or nearly spherical surface. These surfaces form inner boundary surfaces between gas-filled or empty voids and the surrounding quartz glass. Such surfaces are randomly oriented with equal probability in three dimensions. Thus the spatial orientation is statistically homogeneously distributed. There is no preferred direction, unlike the situation which can occur with crystalline materials. This characteristic means that the intensity of the UV light incident on the dispersive element is registered with a weighing factor related to the cosine of the angle of incidence. Accordingly, even radiation incident on the dispersive element at an oblique incidence angle is taken into account. This provides the desired directional independence of the measurement. It is to be noted that a pore content of at least 0.5 vol % is necessary to attain sufficient diffusivity. The greater the pore volume fraction the higher the attenuation presented by the dispersive element. The fact that the pores are preferably closed ensures the sealing capability of the dispersive element and reduces its susceptibility to soiling.

Particularly good results are obtained with a UV sensor according to the present invention wherein the dispersive element contains pores 80% of which have maximum pore diameter <100 microns, preferably <10 microns but including 2, 5, 8, 10, 15, 20, 30, 40, 50 60, 70, 80 and 90 microns, and all ranges therebetween. The smaller the pore dimensions the smaller the individual dispersion centers, and the more homogeneously the diffusivity of the dispersive element is distributed over the volume. It is particularly advantageous if the pore size distribution is as narrow as possible. A high degree of the desired nondirectional dispersion is achieved if all or a substantial portion of the pore sizes are within the range of the wavelengths of UV light being measured.

In a preferred embodiment of the invention UV sensor the dispersive element has an $SiO_2$ content of at least 99, preferably at least 99.9 wt. % and a cristobalite content of $\leq 1$ wt. %. Such a dispersive element has particularly good mechanical strength and very good radiation resistance: e.g., in a test of irradiation of such dispersive elements with UV radiation in the wavelength range of 300–400 nm, only minimal solarization was detected. The low cristobalite content ensures high light permeability and homogeneous distribution of the optical properties, particularly the dispersion of UV light, over the entire volume of the diffusing element.

It is particularly advantageous to provide a UV sensor equipped with an invention dispersive element comprised of quartz glass with a density of at least 2.15 $g/cm^3$. Such a dispersive element has high mechanical and optical strength and resistance to degradation, along with good dispersive characteristics and low light attenuation. The invention UV sensor with a dispersive element having a smooth surface without open pores has proven particularly advantageous regarding ease of handling and good reproducibility and stability of measurements. Such a dispersive element is insensitive to soils and is generally easy to clean. A smooth surface can be produced, e.g., by flame polishing. At the same time, a completely transparent surface coating is produced.

In a preferred embodiment of the invention UV sensor, the dispersive element seals off a light entry opening. The dispersive element of such a sensor is easy to install and replace. It may be fixed to the housing in gas-tight fashion. This embodiment ensures high measurement accuracy, because the UV light being measured is directly incident on the dispersive element from all directions, and from there it is diffused homogeneously onto, among other things, the photodetector. In this embodiment the dispersive element can be mounted on the housing so as to seal the entry opening from a position outside. It may also be mounted so as to seal the opening from a position inside, but such an arrangement sacrifices measurability of radiation incident in a certain angular range in the neighborhood of 0° and 180° (with respect to the surface of incidence of the photodetector). For some applications one can do without the measurement of radiation in this range of angles (the particular range depends on the specific disposition of the dispersive element in the housing).

According to another preferred embodiment of the invention UV sensor, the dispersive element itself comprises the housing thereof. Such an arrangement is enabled by the fact that the quartz glass dispersive material can be subsequently processed, e.g. machined, after initial fabrication. The housing may optionally further comprise a single piece in the form of a cap which covers the photodetector. Such a housing is easy to produce in gas-tight form, and protects the interior components from chemical attack as well as from mechanical stresses. Such a UV sensor is easy to install and maintain. With this embodiment the entire housing may be deemed to be the entry opening for the UV radiation.

An invention UV sensor which has proved particularly advantageous is one in which an optical filter for visible light is disposed between the dispersive element and the photodetector. With such an arrangement the measurement accuracy in the UV range is increased in the case of a UV sensor using a photodetector which is also sensitive in the visible light band. The filter may be fabricated as an independent component, or may be affixed to or combined with the dispersive element or the photodetector, e.g., in the form of a coating.

Another embodiment of the invention UV sensor is one in which an entry opening is bounded laterally by a metal sleeve within which the dispersive element and at least the upper part of the photodetector directed toward the entry opening are disposed. A metal sleeve laterally enclosing the dispersive element and the upper extremity of the photodetector ensures that light cannot reach the photodetector without passing through the dispersive element (such a bypass could distort the measurement). A metal sleeve having a reflecting inner side will contribute to light transmission from the dispersive element to the photodetector. If a filter is provided between the dispersive element and the photodetector, the filter as well is laterally enclosed by the metal sleeve.

The invention will now be further described with reference to the six figures:

In FIG. 1, reference numeral 1 represents the UV sensor as a whole, comprised of a UV photodetector 2, an optional visible light filter 3 (in all subsequent Figures the visible light filter is optional), and a diffusing screen 4 comprised of opaque, amorphous quartz glass. The filter 3 is disposed between the photodetector 2 and the diffusing screen 4. The UV sensor 1 is closed off at the top by a quartz dome 5 which protects the optics of the sensor 1 against damage. To improve the light transmission between the diffusing screen 4 and the filter 3 an interiorly reflecting steel sleeve 6 is provided between these components (3, 4).

In this and the following exemplary embodiments the diffusing screen 4 has an $SiO_2$ content of 99.94 wt. % and a cristobalite content of about 0.5 wt. %. Its opacity is attributable to closed pores representing a volume fraction of about 1%, where 80% of the pores have a maximum pore diameter of <3 micron. Ordinarily the thickness of the diffusing screen is in the range of from 1–2 mm. For a thickness of 1 mm its transmissivity for UV radiation in the wavelength range of 300–400 nm is about 10%. The remainder of the incident light apart from the attenuation fraction is dispersed in all directions. In this way a homogeneous diffusivity is achieved, so that the intensity of the UV light incident on the diffusing screen 4 is registered with a weighing factor related to the cosine of the angle of incidence. This provides the desired directional independence of the measurement.

Because the diffusing screen 4 is comprised of amorphous quartz glass, a homogeneous substance without grain boundaries, it has high mechanical strength and solidity and can be machined. The quartz glass provides high resistance of the diffusing screen 4 to UV radiation. It has a density of 2.18 $g/cm^3$ and a smooth surface without open pores. To provide the smooth surface, flame polishing was used to produce a transparent, pore-free surface layer. It is easy to clean, easy to fuse with quartz glass, and gas-tight (except that helium and hydrogen can diffuse through quartz glass). It is thus easy to handle and enables the UV sensor 1 to be manufactured simply and economically.

In the exemplary embodiment of the invention UV sensor 1 according to FIG. 2, reference numeral 7 represents a housing. Housing 7 has a sleeve-shaped part 8 comprised of high grade alloy steel, interiorly of which a photodetector 2 and the diffusing screen 4 of opaque, amorphous quartz glass are accommodated. A filter 3 for visible light is provided between the photodetector 2 and the diffusing screen 4. The high grade steel sleeve 8 has at its end directed away from the photodetector 2 a diffusing screen 4 disposed in the entry opening for the UV radiation. The diffusing screen 4 is disposed inside the steel sleeve 8. The upwardly open end of sleeve 8 has an edge 10 which partly overlaps the diffusing screen 4.

The inventive UV sensor according to FIG. 2 is particularly good for monitoring the UV radiation in weatherometer equipment and the like.

In the exemplary embodiment of the inventive sensor according to FIG. 3, a housing 7 of high grade alloy steel accommodates a photocell 11 based on SiC and a diffusing screen 4 of opaque, amorphous quartz glass. The housing 7 has an interiorly reflecting sleeve-shaped part 8 and an edge 10 which partially overlaps the diffusing screen 4 and defines the entry opening 9, similarly to the edge 10 described in connection with the exemplary embodiment of FIG. 2. The diffusing screen 4 rests directly on the photocell 11. The photocell 11 and diffusing screen 4 may be adhesively bonded together at their edges. This embodiment does not require a filter for visible light, because an SiC photocell does not detect visible light.

In the embodiment of the inventive sensor according to FIG. 4, inside a housing 7 comprised of high grade alloy steel there are disposed a photocell 2 based on Si, a diffusing screen 4 comprised of opaque, amorphous quartz glass, and an optical filter 12 for visible light, consisting of a dielectric coating of titanium oxide applied to the diffusing screen by vapor deposition. The housing has an interiorly reflecting, sleeveshaped part 8, where here the edge of the sleeve defines the entry opening 9 of the UV sensor. The diffusing screen 4 rests directly on the photocell 2.

In the embodiment of the inventive UV sensor illustrated in FIG. 5 the dispersive element is in the form of a diffusing cap 13 which surrounds a photocell 2 and an optical filter 3. The cap 13 is comprised of opaque, amorphous quartz glass with the properties of the diffusing screen 4 described in connection with the embodiment of FIG. 1. Such a cap 13 can be fabricated from diffusely dispersing quartz glass because this material can be processed mechanically after initial fabrication, e.g. the mechanical processing may comprise sawing, grinding, and drilling. The cap 13 maybe fabricated from a single piece. It preferably contains no joints and therefore can be easily manufactured to be gas-tight. It protects the components disposed inside it from chemical attack and from mechanical stresses.

In the enlargement of region A of FIG. 5 shown in FIG. 6, optional optical filter 3 is applied in the form of an $SiO_2$ coating on the interior side of cap 13, namely in the region of the entry opening 9 for the UV radiation. In this exemplary embodiment the entry opening 9 is bounded laterally by a light-impermeable and interiorly reflecting metal tube 14, within which the photodetector 2 is disposed.

A method of manufacturing dispersive element according to the invention will now be described, for the case of an exemplary embodiment. Molded pieces for producing dispersive elements for UV sensors according to the invention are preferably produced according to the slip-casting method. Exemplary embodiments of methods of producing such molded pieces are described in Ger. Pat. 4,338,807, incorporated herein by reference, the contents of which are expressly referenced here with particular regard to the manufacturing method. The molded pieces produced according to this method are either directly employed as dispersive elements or are employed following mechanical or chemical processing. The dispersive elements may be, e.g., in the form of a diffusing screen or diffusing cap.

This application is based on German applications P 44 34 858.4 filed Sep. 29, 1994 and P 43 38 807.8 filed Nov. 12, 1993, both incorporated herein by reference. Obviously, numerous modifications of the above-described invention are apparent to the art worker, all of which are included herein.

What is claimed as new and desired to be secured by Letters Patent of the United States is:

1. A UV sensor comprising an $SiO_2$-containing dispersive element disposed ahead of a photodetector in the direction of incident UV radiation, wherein said dispersive element comprises quartz glass having interior boundary surfaces whose orientations are statistically homogeneously distributed.

2. The UV sensor according to claim 1, further comprising a housing having an entry opening for UV radiation.

3. A UV sensor according to claim 1 wherein the dispersive element has closed pores.

4. A UV sensor according to claim 3 wherein a volume fraction of said dispersive element represented by the pores is in the range of from 0.5–10%.

5. A UV sensor according to claim 1, wherein the dispersive element contains pores, 80% of which have maximum pore diameters less than 100 microns.

6. A UV sensor according to claim 1, wherein the dispersive element has an $SiO_2$ content of at least 99 wt. % and a cristobalite content of at most 1 wt. %.

7. A UV sensor according to claim 1, wherein the dispersive element has a density of at least 2.15 $g/cm^3$.

8. A UV sensor according to claim 1, wherein the dispersive element has a smooth surface without open pores.

9. A UV sensor according to claim 2, wherein the dispersive element is in the form of a disc or screen, which disc or screen closes off the entry opening.

10. A UV sensor according to claim 1, wherein the dispersive element forms a housing.

11. A UV sensor according to claim 1, wherein an optical filter for visible light is disposed between the dispersive element and the photodetector.

12. A UV sensor according to claim 2, wherein the entry opening is bounded laterally by a steel sleeve within which the dispersive element and at least an upper part of the photodetector directed toward the entry opening are disposed.

13. A UV sensor according to claim 4, wherein the volume fraction represented by said pores is less than 5% and wherein said pores have a maximum pore diameter of less than 10 microns.

* * * * *